United States Patent
Zhou et al.

(10) Patent No.: US 10,014,036 B1
(45) Date of Patent: Jul. 3, 2018

(54) LOW POWER AND AREA EFFICIENT MEMORY RECEIVER

(71) Applicant: Intel Corporation, Santa Clara, CA (US)

(72) Inventors: Kuan Zhou, Hillsboro, OR (US); Bruce Querbach, Hillsboro, OR (US); Li Pan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 7 days.

(21) Appl. No.: 15/393,951

(22) Filed: Dec. 29, 2016

(51) Int. Cl.
*G11C 11/24* (2006.01)
*G11C 5/02* (2006.01)
*G11C 7/10* (2006.01)

(52) U.S. Cl.
CPC ..................................... *G11C 7/10* (2013.01)

(58) Field of Classification Search
CPC ... H03K 19/017509; H03K 19/018521; H03K 19/0002; H03K 19/018507; H03K 19/018528; G11C 7/067; G11C 5/02; G11C 11/24
See application file for complete search history.

(56) References Cited

U.S. PATENT DOCUMENTS

| | | | |
|---|---|---|---|
| 6,826,100 B2 | 11/2004 | Ellis et al. | |
| 7,139,957 B2 | 11/2006 | Querbach et al. | |
| 7,228,515 B2 | 6/2007 | Querbach et al. | |
| 7,480,360 B2 | 1/2009 | Querbach et al. | |
| 7,501,863 B2 | 3/2009 | Querbach et al. | |
| 8,054,676 B2 * | 11/2011 | Tanguay | G06F 13/1694 365/149 |
| 8,154,901 B1 * | 4/2012 | Lee | H05K 1/0243 326/30 |
| 8,461,896 B2 * | 6/2013 | Zhuang | H03K 3/356113 327/307 |
| 8,868,992 B2 | 10/2014 | Spry et al. | |
| 9,659,626 B1 * | 5/2017 | Querbach | G11C 11/40618 |
| 2008/0090545 A1 | 4/2008 | Tokairin et al. | |
| 2008/0280578 A1 * | 11/2008 | Nimura | H03F 1/342 455/249.1 |
| 2013/0151875 A1 | 6/2013 | Huynh | |
| 2014/0009982 A1 | 1/2014 | Li et al. | |
| 2015/0127983 A1 | 5/2015 | Trobough et al. | |

(Continued)

OTHER PUBLICATIONS

U.S. Appl. No. 15/055,153, entitled "Supporting Multiple Memory Types in a Memory Slot", filed Feb. 26, 2016, 43 pages.

(Continued)

*Primary Examiner* — Hien Nguyen
(74) *Attorney, Agent, or Firm* — Jordan IP Law, LLC

(57) ABSTRACT

An embodiment of a receiver apparatus may include high pass components to pass high frequency components of an input signal, low pass components to pass low frequency components of the input signal, and an amplifier communicatively coupled to the high pass components and the low pass components to amplify respective signals passed by the high pass components and the low pass components, wherein the low pass components include a level shifter to shift a common mode voltage level of the input signal to a switch threshold voltage for the amplifier in accordance with at least two different types of memory devices. Other embodiments are disclosed and claimed.

19 Claims, 6 Drawing Sheets

(56) References Cited

U.S. PATENT DOCUMENTS

| | | |
|---|---|---|
| 2015/0187439 A1 | 7/2015 | Querbach et al. |
| 2015/0304135 A1 | 10/2015 | Scouten |
| 2016/0261254 A1 | 9/2016 | Peschke |
| 2017/0093525 A1* | 3/2017 | Navid .................. H04L 1/0036 |
| 2017/0131730 A1* | 5/2017 | Joffe ................. H03H 11/0472 |

OTHER PUBLICATIONS

Stephens, Ransom, "Optimize equalization for FFE, CCTLE, DFE, and crosstalk," EDN Network, Oct. 21, 2015, 4 pages.

Bucher et al., "A 6.4-Gb/s Near-Ground Single-Ended Transceiver for Dual-Rank DIMM Memory Interface Systems," IEEE Journal of Solid-State Circuits, vol. 49, No. 1, Jan. 2014, pp. 127-139.

Dalermo, Sam, "Lecture 8: RX FIR, CTLE, & DFE Equalization," ECEN720: High-Speed Links Circuits and Systems, Analog & Mixed-Signal Center, Texas A&M University, 34 pages.

International Search Report and Written Opinion for International Patent Application No. PCT/US2017/060626, dated Feb. 7, 2018, 12 pages.

\* cited by examiner

LOW POWER AND AREA EFFICIENT MEMORY RECEIVER

TECHNICAL FIELD

Embodiments generally relate to input/output (IO) receivers. More particularly, embodiments relate to a low power and area efficient memory receiver.

BACKGROUND

In some communication and server systems (e.g. 2 socket or 4 socket), significant printed circuit board area and platform power may be dedicated to system memory. In some systems, for example, eight dual-inline memory modules (DIMMs) may be attached to each central processor unit (CPU). As a result, there may be many instances of identical double date rate (DDR) IO circuits replicated across the platform both on the DIMM and on the CPU. In some situations, both the CPU and DIMMs may become power limited by what the platform can deliver and what the rack can cool. These power limits may translate into frequency and performance limits on the CPU and platform.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Various embodiments described herein may include a memory component and/or an interface to a memory component. Such memory components may include volatile and/or nonvolatile memory. Nonvolatile memory may be a storage medium that does not require power to maintain the state of data stored by the medium. Non-limiting examples of nonvolatile memory may include any or a combination of: solid state memory (such as planar or 3-dimensional (3D) NAND flash memory or NOR flash memory), 3D cross point memory, storage devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, magnetoresistive random access memory (MRAM) that incorporates memristor technology, spin transfer torque MRAM (STT-MRAM), electrically erasable programmable read-only memory (EEPROM), other various types of non-volatile random access memories (RAMs), and magnetic storage memory. In some embodiments, 3D cross point memory may comprise a transistor-less stackable cross point architecture in which memory cells sit at the intersection of word lines and bit lines and are individually addressable and in which bit storage is based on a change in bulk resistance. In particular embodiments, a memory component with non-volatile memory may comply with one or more standards promulgated by the Joint Electron Device Engineering Council (JEDEC), such as JESD218, JESD219, JESD220-1, JESD223B, JESD223-1, or other suitable standard (the JEDEC standards cited herein are available at www.jedec.org).

Volatile memory may be a storage medium that requires power to maintain the state of data stored by the medium. Non-limiting examples of volatile memory may include various types of random access memory (RAM), such as dynamic random access memory (DRAM) or static random access memory (SRAM)), thyristor RAM (T-RAM) or zero-capacitor RAM (Z-RAM). One particular type of DRAM that may be used in a memory module is synchronous dynamic random access memory (SDRAM). In particular embodiments, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, JESD209-4 for LPDDR4, and (these standards are available at www.jedec.org). Such standards (and similar standards) may be referred to as DDR-based standards and communication interfaces of the storage devices that implement such standards may be referred to as DDR-based interfaces.

Figure 1:
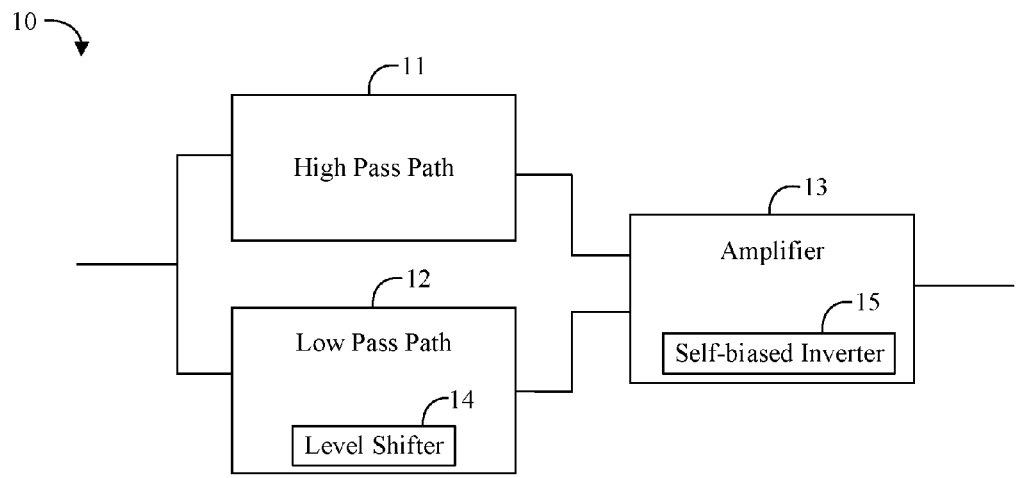
FIG. 1 is a block diagram of an example of a receiver apparatus according to an embodiment.

Turning now to FIG. 1, an embodiment of a receiver apparatus 10 may include high pass components 11 to pass high frequency components of an input signal, low pass components 12 to pass low frequency components of the input signal, and an amplifier 13 communicatively coupled to the high pass components 11 and the low pass components 12 to amplify respective signals passed by the high pass components 11 and the low pass components 12. The low pass components 12 may include a level shifter 14 to shift a common mode voltage level of the input signal to a switch threshold voltage for the amplifier 13 in accordance with at least two different types of memory devices. For example, the common mode voltage of the input signal may correspond to an average of the input signal high ($V_{IH}$) and input signal low ($V_{IL}$, e.g. about ($V_{IH}+V_{IL}$)/2). The amplifier 13 may include a self-biased inverter 15.

In some embodiments of the receiver apparatus 10, the high pass components 11, the low pass components 12, and the amplifier 13 may all be part of a single stage, continuous time linear equalizer (CTLE) which is electronically adjustable to receive signals from the at least two different types of memory devices. For example, the CTLE may include components (e.g. resistors, capacitors, etc.) that provide a linear filter applied at the receiver apparatus 10 that attenuates low-frequency signal components, amplifies signal components around a frequency (e.g. about empirically two thirds of the memory IO data rate or beyond), and filters off higher frequencies. The ratio between the peak gain and the DC gain of the CTLE components may be adjusted, for example, to compensate for the high frequency loss from a memory channel.

For example, the low pass path may attenuate high frequency signal components more significantly and the high pass path may attenuate low frequency signal components more significantly. A resistor-based level shifter, for example, may be placed inside the low pass path and a capacitor may be placed in the high pass path. The high pass components 11, for example, may include a capacitor which may have at least two orders of magnitude greater impedance than a connected termination circuit (e.g. at below about two thirds of the data rate frequency). The level shifter may include a variable resistor network which may have at least two orders of magnitude greater resistance than a connected termination circuit. For example, the variable resistor network may include a first variable resistor having a first node coupled to a common input front end voltage and a second node coupled to the input of the self-biased inverter, and a second variable resistor having a first node coupled to the input of the self-biased inverter and a second node coupled to ground. A value for each of the first and second variable resistors may be electronically adjustable to provide the switch threshold voltage at the input of the self-biased inverter for the at least two different types of memory devices. In some embodiments, the first and second variable resistors may each be transistor-based. For example, in some embodiments all of the receiver apparatus 10 components may be transistor-based to provide an efficient implementation which may be fabricated on a silicon die.

In some embodiments of the receiver apparatus 10, the at least two different types of memory devices may include a first type of memory device, a second type of memory device, and a third type of memory device. For the first type of memory device, for example, the first variable resistor may be adjusted to be substantially off and the second variable resistor may be adjusted to be substantially off. For the second type of memory device, for example, the first variable resistor may be adjusted to be substantially off and the second variable resistor may be adjusted to be substantially on. For the third type of memory device, for example, the first variable resistor may be adjusted to be substantially on and the second variable resistor may be adjusted to be substantially off. For example, the first type of memory device technology may be one of a DDR1, DDR2, DDR3, LPDDR1, LPDDR2, or LPDDR3 DRAM module. For example, the second type of memory device technology may be one of a DDR4 or DDR4L DRAM module. For example, the third type of memory device technology may be a LPDDR4 DRAM module.

Advantageously and surprisingly, some embodiments having an arrangement of high pass components, low pass components including a level shifter, and an amplifier including a self-biased inverter, as a described herein for an IO receiver may reduce power consumption of the IO receiver and may also reduce the silicon area of the IO receiver. Because there may be numerous instances of IO receivers in some integrated circuits, power and area savings provided by some embodiments may have a significant impact on an overall power reduction and silicon area reduction of those integrated circuits.

Embodiments of each of the above high pass components 11, low pass components 12, amplifier 13, self-biased inverter 15, level shifter 14, and other components of the receiver apparatus 10 may be implemented in hardware, software, or any suitable combination thereof. For example, hardware implementations may include configurable logic such as, for example, programmable logic arrays (PLAs), field programmable gate arrays (FPGAs), complex programmable logic devices (CPLDs), or in fixed-functionality logic hardware using circuit technology such as, for example, application specific integrated circuit (ASIC), complementary metal oxide semiconductor (CMOS) or transistor-transistor logic (TTL) technology, or any combination thereof. Alternatively, or additionally, some operational aspects of these components (e.g. configuring or adjusting the level shifter 14) may be implemented in one or more modules as a set of logic instructions stored in a machine- or computer-readable storage medium such as random access memory (RAM), read only memory (ROM), programmable ROM (PROM), firmware, flash memory, etc., to be executed by a processor or computing device. For example, computer program code to carry out the operations of the components may be written in any combination of one or more operating system applicable/appropriate programming languages, including an object oriented programming language such as JAVA, SMALLTALK, C++, C# or the like and conventional procedural programming languages, such as the "C" programming language or similar programming languages.

Figure 2:
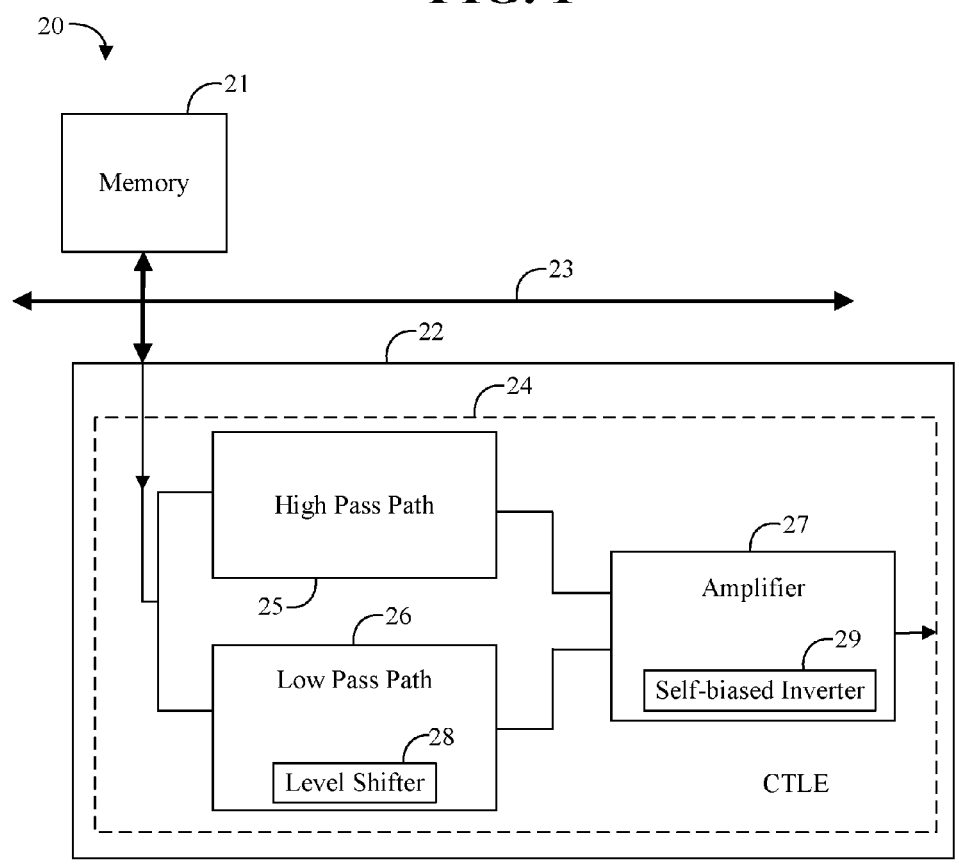
FIG. 2 is a block diagram of an example of an electronic processing system according to an embodiment.

Turning now to FIG. 2, an embodiment of an electronic processing system 20 may include a memory component 21 and an electronic component 22 communicatively coupled to the memory component 22 (e.g. over a channel 23). The electronic component may include a receiver 24 to receive a signal from the memory component 21. In some embodiments of the system 20, the receiver 24 may be similarly configured as the receiver apparatus 10 described herein. Specifically, the receiver 24 may include high pass components 25 to pass high frequency components of the signal, low pass components 26 to pass low frequency components of the signal, and an amplifier 27 communicatively coupled to the high pass components 25 and the low pass components 26 to amplify respective signals passed by the high pass components 25 and the low pass components 26, where the low pass components 26 may include a level shifter 28 to shift a common mode voltage level of the signal to a switch threshold voltage for the amplifier 27 in accordance with at least two different types of memory devices. For example, the amplifier 27 may include a self-biased inverter 29.

In some embodiments of the electronic processing system 20, the high pass components 25, the low pass components 26, and the amplifier 27 may all be part of a single stage, CTLE which is electronically adjustable to receive signals from the at least two different types of memory devices. For example, the high pass components 25 may include a capacitor which may have at least two orders of magnitude greater impedance than a connected termination circuit (e.g. at below about empirically two thirds of the data rate frequency). The level shifter 28 may include a variable resistor network which may have at least two orders of magnitude greater resistance than a connected termination circuit. For example, the variable resistor network may include a first variable resistor having a first node coupled to a common input front end voltage and a second node coupled to the input of the self-biased inverter, and a second variable resistor having a first node coupled to the input of the self-biased inverter and a second node coupled to ground. A value for each of the first and second variable resistors maybe electronically adjustable to provide the switch threshold voltage at the input of the self-biased inverter for the at least two different types of memory devices. For example, first and second variable resistors may each be transistor-based. In some embodiments, all of the components of the receiver 24 may be transistor-based and implemented on a same silicon die as the electronic component 22.

In some embodiments of the electronic processing system 20, the at least two different types of memory devices may include a first type of memory device, a second type of memory device, and a third type of memory device. For the first type of memory device, for example, the first variable resistor may be adjusted to be substantially off and the second variable resistor may be adjusted to be substantially off. For the second type of memory device, for example, the first variable resistor may be adjusted to be substantially off and the second variable resistor may be adjusted to be substantially on. For the third type of memory device, for example, the first variable resistor may be adjusted to be substantially on and the second variable resistor may be adjusted to be substantially off. For example, the first type of memory device may be one of a DDR1, DDR2, DDR3, LPDDR1, LPDDR2, or LPDDR3 DRAM module. For example, the second type of memory device may be one of a DDR4 or DDR4L DRAM module. For example, the third type of memory device module may be a LPDDR4 DRAM module.

In some embodiments of the system 20, as just noted, a memory device included in the memory component 21 may include one of a DDR DRAM and an LPDDR DRAM (e.g. which meets a particular memory specification). The electronic component 22 may include, for example, one of a CPU and a memory controller. For example, the electronic component 22 may be further configured to determine a type of the memory device included in the memory component 21 which is communicatively coupled to the electronic component 22 and to configure the level shifter 28 in accordance with the type of the memory device included in the memory component 21. For example, during a setup, installation, or boot process, the CPU or the memory controller may identify the type of the memory device technology installed (e.g. DDRx, where x=1-4) and thereafter set a storage location or registers to control the state of the variable resistors based on the type of memory device technology (e.g. first and second resistors both off for DDR1-3 and LPDDR1-3, first resistor off and second resistor on for DDR4, and first resistor on and second resistor off for LPDDR4). For example, a resistor being off may correspond to a relatively high resistance value (e.g. about in the order of a few kilo-ohms (kohms) or more) while a resistor being on may correspond to a relatively low resistance value (e.g. about a few to a few hundred ohms).

Embodiments of each of the above memory component 21, electronic component 22, receiver 24, high pass components 25, low pass components 26, amplifier 27, level shifter 28, self-biased inverter 29, and other components of the electronic processing system 20 may be implemented in hardware, software, or any combination thereof. For example, hardware implementations may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, some operational aspects of these components may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more operating system applicable/ appropriate programming languages, including an object oriented programming language such as JAVA, SMALLTALK, C++, C# or the like and conventional procedural programming languages, such as the "C" programming language or similar programming languages.

Figure 3A:
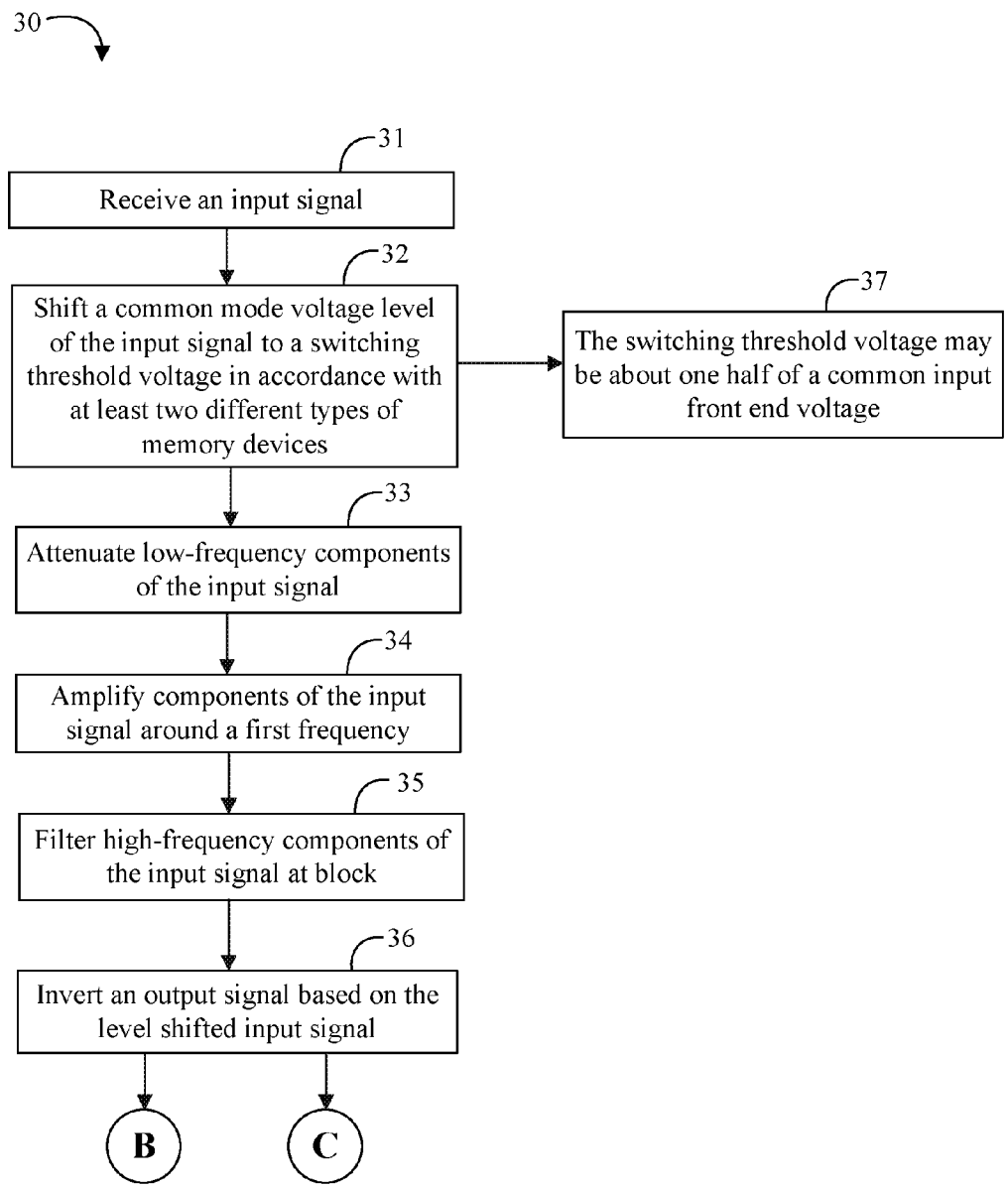
FIGS. 3A to 3C are flowcharts of an example of a method of receiving a signal according to an embodiment.
Figure 3B:
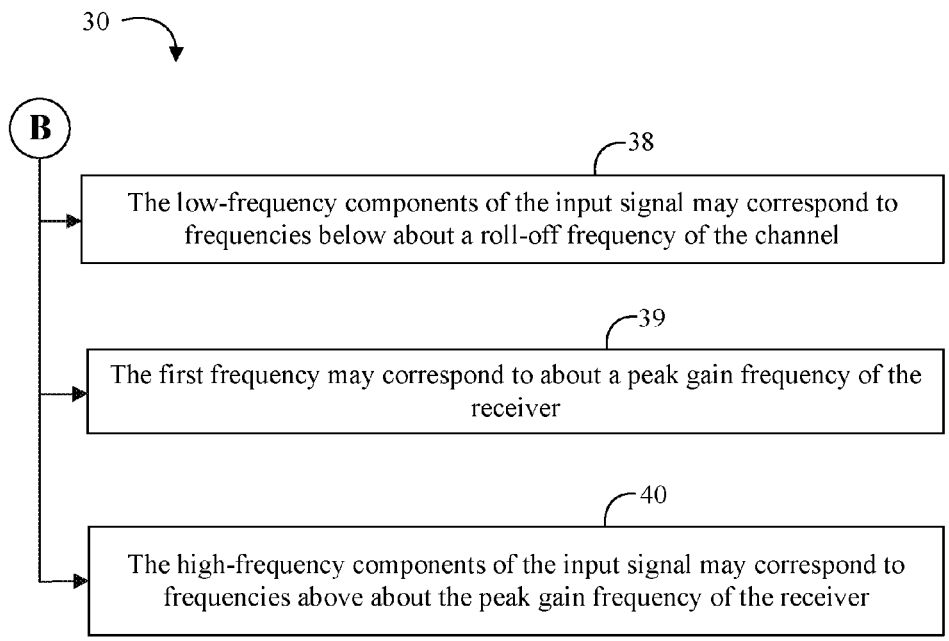
Figure 3C:
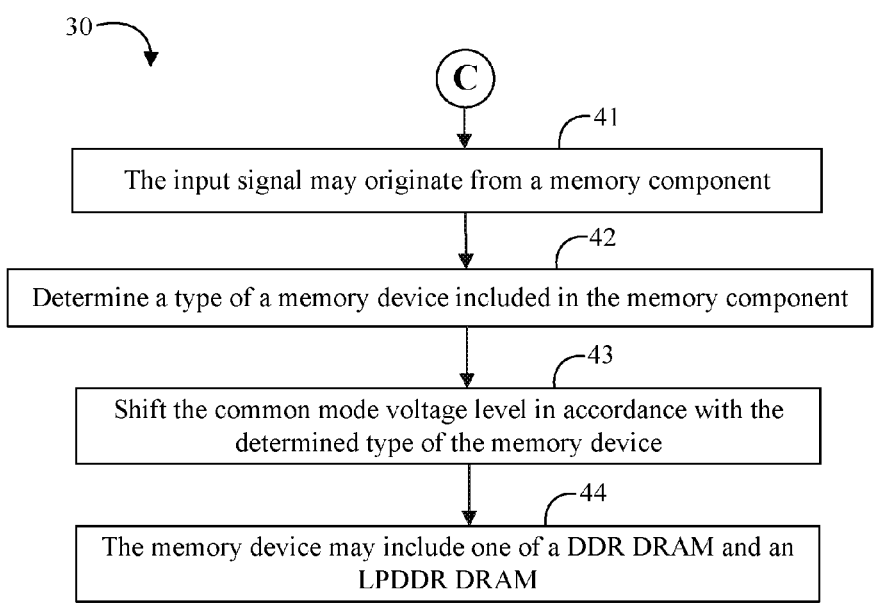

Turning now to FIG. 3, an embodiment of a method 30 of receiving a signal may include receiving an input signal at block 31, shifting a common mode voltage level of the input signal to a switching threshold voltage in accordance with at least two different types of memory devices at block 32, attenuating low-frequency components of the input signal at block 33, amplifying components of the input signal around a first frequency at block 34, filtering high-frequency components of the input signal at block 35, and inverting an output signal based on the level shifted input signal at block 36. For example, the switching threshold voltage may be about one half of a common input front end voltage at block 37.

In some embodiments of the method 30, the low-frequency components of the input signal may correspond to frequencies below about a roll-off frequency of the channel at block 38, the first frequency may correspond to about a peak gain frequency of the receiver at block 39, and the high-frequency components of the input signal may correspond to frequencies above about the peak gain frequency of the receiver at block 40.

In some embodiments of the method 30, the input signal may originate from a memory component at block 41, and the method 30 may further include determining a type of a memory device included in the memory component at block 42, and shifting the common mode voltage level in accordance with the determined type of the memory device at block 43. For example, the memory device may include one of a DDR DRAM and an LPDDR DRAM at block 44.

Embodiments of the method 30 may be implemented in an electronic processing system or a receiver apparatus such as, for example, those described herein. More particularly, hardware implementations of the method 30 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the method 30 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more operating system applicable/appropriate programming languages, including an object oriented programming language such as JAVA, SMALLTALK, C++ or the like and conventional procedural programming languages, such as the "C" programming language or similar programming languages. For example, embodiments of the method 30 may be implemented on a computer readable medium as described in connection with Examples 28 to 32 below.

Figure 4:
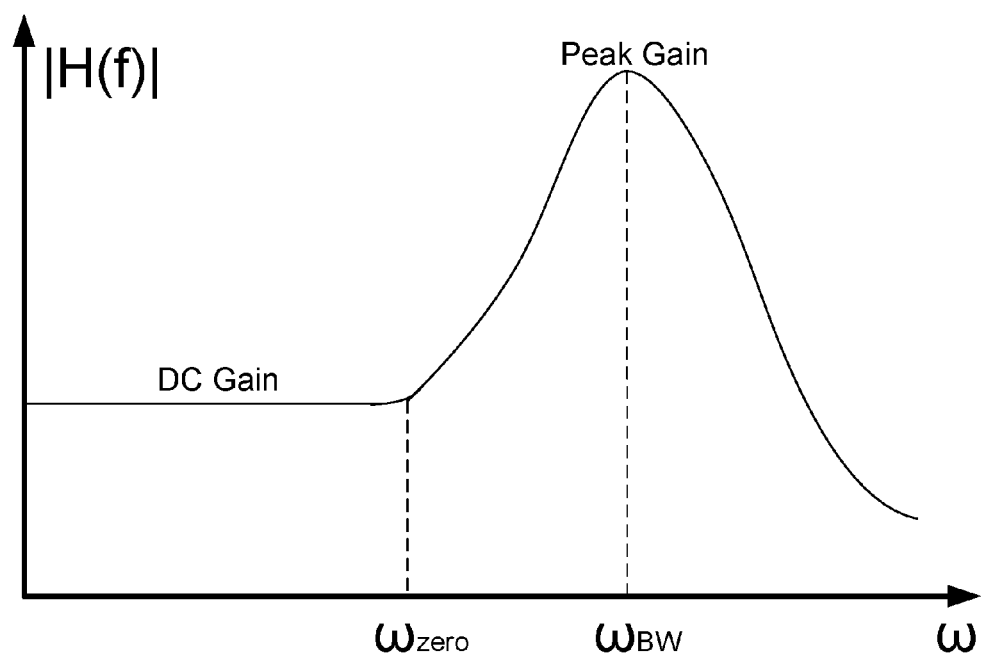
FIG. 4 is a graph of an example of gain versus frequency according to an embodiment.

Turning now to FIG. 4, an example of a transfer function for an IO receiver according to an embodiment may have a direct current (DC) gain which may be relatively flat to $\omega_{ZERO}$ (e.g. about the roll-off frequency of the channel). The gain may then increase sharply to a peak gain frequency of the receiver $\omega_{BW}$ (e.g. the bandwidth of the receiver, about two thirds of a data rate frequency), and then roll-off at frequencies above $\omega_{BW}$. The ratio between the peak gain and the DC gain of the CTLE components may be adjusted, for example, to compensate for the high frequency loss from the memory channel. For example, the transfer function may be configured to provide a roughly an inversion of the memory channel transfer function across the IO receiver bandwidth.

Figure 5:
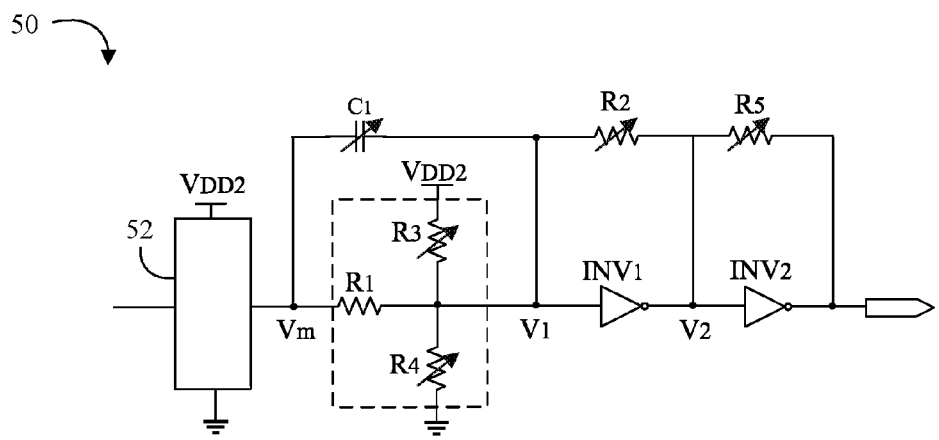
FIG. 5 is a schematic diagram of an example of a receiver apparatus according to an embodiment.

Turning now to FIG. 5, an embodiment of a receiver apparatus 50 may include a termination circuit 52 (e.g. off-die or on-die) coupled between a common input front end voltage ($V_{DD2}$) and ground, the termination 52 having an input node to receive an input signal and an output node, a first resistor R1 having a first node coupled to the output node of the termination 52 and a second node, a capacitor C1 having a first node coupled to the first node of the first resistor R1 and a second node, a second resistor R2 having a first node coupled to the second node of the capacitor C1 and a second node, a third resistor R3 having a first node coupled to the second node of the first resistor R1 and a second node coupled to the common input front end voltage ($V_{DD2}$), a fourth resistor R4 having a first node coupled to the second node of the first resistor R1 and a second node coupled to ground, and a first inverter INV1 having a first node coupled to the second node of the first resistor R1 and a second node coupled to the second node of the second resistor R2. The third and fourth resistors R3, R4 may each include a variable resistor element and a value for each of the third and fourth resistors R3, R4 may be electronically adjustable to provide a switch threshold voltage V1 at the first node of the first inverter INV1 in accordance with at least two types of memory devices. The receiver apparatus 50 may further include a fifth resistor R5 having a first node coupled to the second node of the second resistor R2 and a second node, and a second inverter INV2 having a first node coupled to the second node of the first inverter INV1 and a second node coupled to the second node of the fifth resistor R5.

In some embodiments of the receiver apparatus 50, the at least two different types of memory devices may include a first type of memory device, a second type of memory device, and a third type of memory device. For the first type of memory device, for example, the third variable resistor R3 may be adjusted to be substantially off and the fourth variable resistor R4 may be adjusted to be substantially off (e.g. to support DDR1, DDR2, DDR3, LPDDR1, LPDDR2, and LPDDR3 memory modules). For the second type of memory device, for example, the third variable resistor R3 may be adjusted to be substantially off and the fourth variable resistor R4 may be adjusted to be substantially on (e.g. to support DDR4 memory modules). For the third type of memory device, for example, the third variable resistor R3 may be adjusted to be substantially on and the fourth variable resistor R4 may be adjusted to be substantially off (e.g. to support LPDDR4 memory modules).

Figure 6:
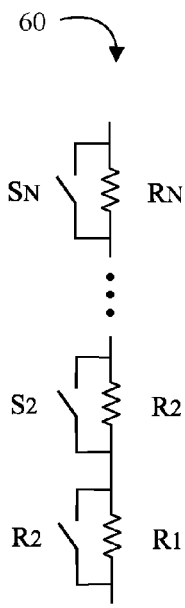
FIG. 6 is a schematic diagram of an example of a variable resistor according to an embodiment.

Turning now to FIG. 6, some embodiments described herein may include variable resistor networks or variable resistor elements. A non-limiting example of a suitable variable resistor structure 60 may include a series of resistor elements $R_1$, $R_2$, through $R_N$ each coupled in parallel with respective bypass switches $S_1$, $S_2$, through $S_N$ to bypass those resistor elements. Opening the bypass switch allows current to flow through the corresponding resistor and closing the switch bypasses the resistor (e.g. effectively removing the resistor from the series circuit). The value of the variable resistor structure 60 may be electronically adjusted by selectively opening and closing the switches $S_1$ through $S_N$ in accordance with a desired amount of resistance for the variable resistor structure 60.

Figure 7:
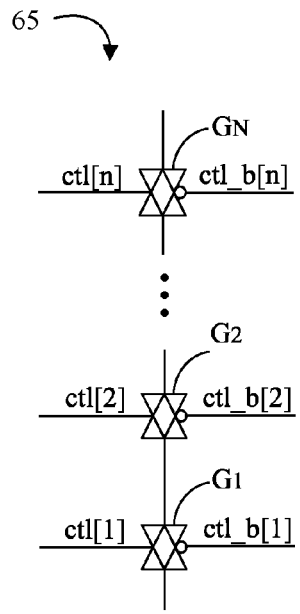
FIG. 7 is a schematic diagram of an example of a transistor-based variable resistor according to an embodiment.

Turning now to FIG. 7, a non-limiting example of a suitable transistor-based variable resistor 65 may include a set of transistors $G_1$, $G_2$, through $G_N$ configured in a pass gate arrangement having corresponding complimentary logic signals ctl[1]/clt_b[1], ctl[2]/ctl_b[2], through ctl[n]/ctl_b[n]. The pass gates may be either turned off to provide a large resistance or on to bypass a specific pass gate stage. For example, due to leakage current the resistance provided by each pass gate stage in the off state may be on the order of one to a few kohms. The value of the variable resistor structure 65 may be electronically adjusted by selectively enabling the gates of the transistors $G_1$ through $G_N$ in accordance with a desired amount of resistance for the variable resistor structure 65.

Figure 8:
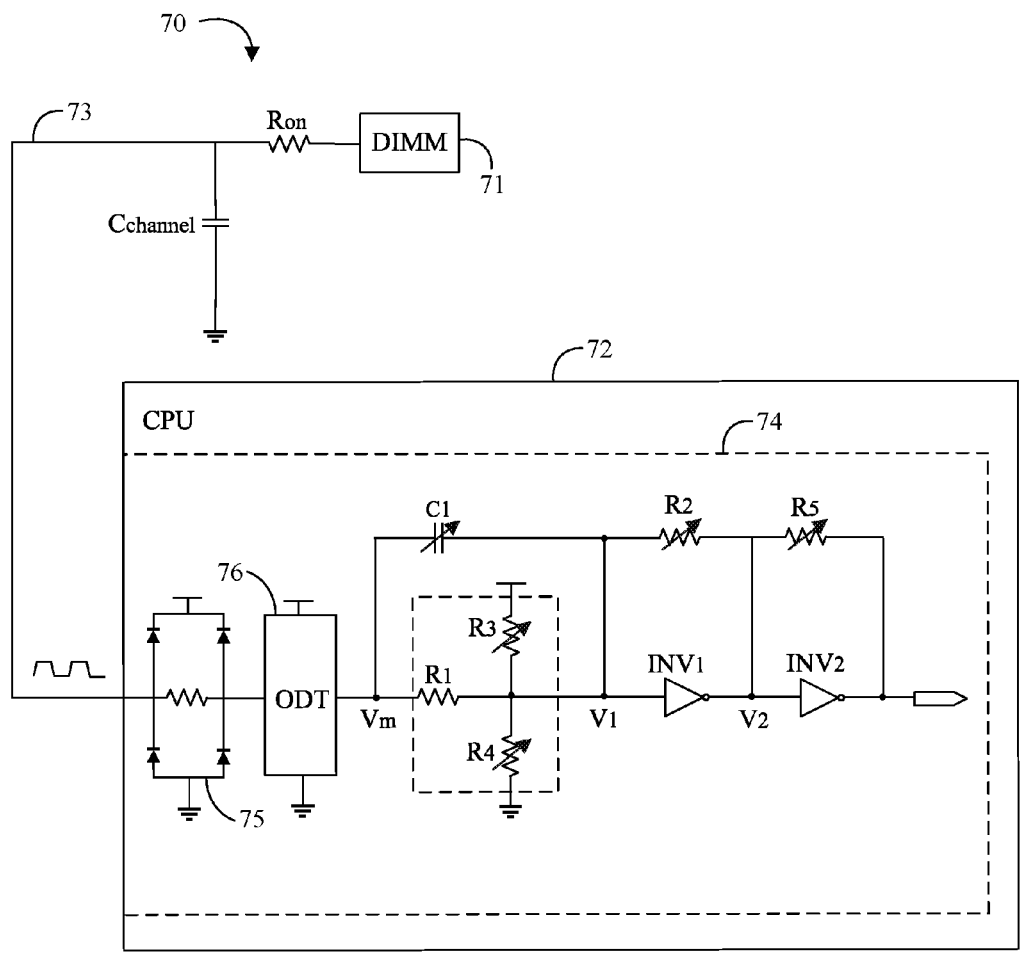
FIG. 8 is a schematic diagram of an example of another electronic processing system according to an embodiment.

Turning now to FIG. 8, an embodiment of an electronic processing system 70 may include one or more DIMMs 71 communicatively coupled to a CPU 72 over a communication channel 73 (e.g. wiring or busses). The resistor $R_{ON}$ may represent a simplified lumped impedance of the channel 73. The capacitor $C_{CHANNEL}$ may represent a lumped capacitance value for the channel 73. The CPU 72 may include a receiver 74 to receive a signal from the DIMM(s) 71 over the channel 73. For example, the receiver 74 may be similar to the receiver apparatus 50 as described herein, and may also include an electrostatic discharge (ESD) protection circuit 75 coupled to an on-die termination (ODT) 76. In practice, the CPU 72 may include numerous receivers 74 (e.g. corresponding to one receiver per IO pin).

Some IO receivers may include both an n-channel metal-oxide semiconductor (NMOS) differential amplifier and a p-channel metal-oxide semiconductor (PMOS) differential amplifier in the receiver to accommodate different common mode voltages of input signals across different DDR standards. For example, LPDDR3/4 may have a VSS terminated ODT while DDR4 may have a $V_{DD2}$ terminated ODT (e.g. 1.2V). The PMOS stage of the receiver may be used to support LPDDR3/4 while the NMOS stage may be used to support DDR4/4L, because the common mode input voltages are different. The two amplifier design, however, may increase the silicon area, development time and complexity, and power consumption in each IO receiver.

Advantageously, some embodiments may provide a universal low power and small area receiver 74 to receive signals from memory modules (e.g. DIMM 71) and/or other high speed devices. For example, some embodiments of the receiver 74 may be considered universal because a single stage receiver may be used for a wide variety of memory standards (e.g. including DDRx/LPDDRx; where x=1-4) or other high speed signals. Some embodiments of the receiver may be further applicable to future extensions of the DDR/LPDDR standards and other memory devices/components as well (e.g. DDR5/LPDDR5, DDR6/LPDDR6, etc.).

Because there may be multiple instances of DDR IO circuits, for example, any extra power utilized by the IO may be multiplied (e.g. by 64 times or more). With the increased frequency demand of newer generation memory, the complexity of a multi-stage DDR IO receiver may also increase. Advantageously, some embodiments of a single stage receiver may save silicon area, which may reduce design complexity and manufacturing costs. Some embodiments of a single stage receiver may reduce both silicon area and power consumption, advantageously reducing overall customer cost. Some embodiments may provide a receiver architecture which allows a corresponding transmitter power consumption to be much lower because some embodiments of the receiver can capture small input signals.

In particular, some embodiments may provide one or more of the following advantages: a single stage, high performance receiver for all DDR standards; a substantial power reduction; a substantial silicon area reduction; much smaller supply noise impact and delay; smaller jitter; process, supply voltage, and temperature (PVT) robustness (e.g. because the CTLE components may provide a ratio-ed design).

The input to the receiver 74 may be a series of 1-bit, high frequency data with different common mode voltages depending on the DDR standards. The signal output of the DIMM 71 (e.g. from a DRAM transmitter) may travel through the channel 73 and then may arrive at the receiver 74 (e.g. on a die of the CPU 72). The resistor $R_{ON}$ may correspond to the simplified lumped effective impedance from the DIMM 71 to the receiver 74. The capacitor $C_{CHANNEL}$ may correspond to the simplified lumped channel capacitance.

Without being limited to theory of operation, three elements of the receiver 74 may include CTLE components, level shifter components, and self-biased inverter components. For example, resistor R1, capacitor C1, and resistor R2 may correspond to CTLE components that are configured such that the receiver 74 may handle high speed input streams (e.g. many gigabits per second). The level shifter components in the front end (e.g. resistors R3 and R4), for example, may ensure that the receiver 74 may be compatible with DDR standards having different common voltages (e.g. no matter whether the ODT is $V_{DD2}$ terminated, VSS terminated, or $V_{DD2}/2$ terminated). The self-biased inverter components (e.g. inverter INV1 and resistor R2), for example, may be PVT robust and may separately provide a high bandwidth receiver component.

Compared with some other IO receivers, some embodiments of the receiver 74 may provide one or more of the following advantages: 1) reduced silicon area because some other IO receivers may require bias circuitry while some embodiments of the receiver 74 may have little or no bias circuitry; 2) reduced silicon area because some embodiments of the receiver 74 may have no reference voltage generator; 3) reduced silicon area because some other IO receivers may require resistor and/or capacitor templates for their CTLE components while some embodiments of the receiver 74 may include completely transistor-based CTLE components; 4) reduced supply noise impact because some other IO receivers may have a moderate supply noise impact while some embodiments of the receiver 74 may provide noise reduction through the feedback loop; and 5) higher bandwidth because the combination of the CTLE and simple self-biased inverter can provide about two or three times higher maximum input signal speeds compared to some traditional amplifier approaches.

To cover all current DDR standards for various memory device technologies, some embodiments of the receiver 74 may be configured as follows: 1) for DDR1/DDR2/DDR3, the termination may be $V_{DD2}/2$, and the resistors R3 and R4 may both be off; 2) for DDR4/4L, the ODT termination may be $V_{DD2}$, and the resistor R3 may be off and the resistor R4 may be on; 3) for LPDDR1/2, there may be no ODT termination, and the resistors R3 and R4 may both be off; 4) for LPDDR3, optionally the ODT termination may be $V_{DD2}/2$, and the resistors R3 and R4 may both be off; 5) for LPDDR4, the ODT termination may be VSS, and the resistor R3 may be on and the resistor R4 may both off. In this context, off corresponds to the value of the resistor being present in the circuit and on corresponds to the resistor being bypassed. Future and other signaling standards may also be covered because some embodiments of the receiver 74 may provide a wide range of resistance values for the resistors R3 and R4 to accommodate a wide range of level shifting.

In practice, the receiver 74 may include the second inverter INV2 so that the output signal has the same phase as the input signal (e.g. not inverted). The CTLE may be implemented through the use of the resistors R1, R2 and the capacitor C1. At direct current (DC) or low frequencies, the capacitor C1 may be open and the gain may be approximately $-R2/R1$. At high frequencies the impedance of C1 may be comparably much smaller than R1. Accordingly, the alternating current (AC) gain may be approximately $-R2*\omega C1$.

Some embodiments of the receiver 74 may have an advantageous arrangement of CTLE components which may reduce power consumption of the receiver 74 and also the silicon area of the receiver 74. Because there may be numerous instances of IO receivers in some integrated circuits, power and area savings provided by some embodiments of the receive 74 may have a significant impact on an overall power reduction and silicon area reduction of those integrated circuits.

Advantageously, some embodiments of the receiver 74 may include a resistor based level shifter without negatively impacting the bandwidth of the receiver 74 while accommodating a variety of ODT terminations (e.g. including $V_{DD2}$, VSS, or $V_{DD2}/2$ terminated). For example, an about fifty (50) ohm termination within the ODT advantageously may not be impacted by the level shifter and the receiver 74 can handle a wide variety of input common mode voltages. In some embodiments of the receiver 74, for example, the resistors R1, R3, and R4 (e.g. when present in the variable resistor network) may each be on the order of tens of thousands of ohms (10s of kohms). Advantageously, the addition of the resistors R1, R3, and/or R4 in the level shifter does not impact the 50 ohm termination.

Compared to the PAD cap that may be on the order of pico-Farads (pFs, $10^{-12}$ Farads), C1 may be on the order of ten to fifty fento-Farads (10-50 fFs, $10^{-15}$ Farads). Advantageously, this small capacitance does not impact the signal quality. On the contrary, the small value of C1 may help expand the bandwidth of the receiver 74 through CTLE. Even though a large resistance from the resistors R1, R3, and/or R4 may be seen at the node V1, at high frequencies this resistance may be bypassed because the impedance from C1 becomes low. Advantageously, a wide range of input common mode voltages may be always level shifted to a switch threshold voltage of about $V_{DD2}/2$ at the V1 node no matter how the ODT is terminated and the receiver 74 may handle a wide range of input common mode voltages.

Further advantageously, some embodiments of the receiver 74 may provide a PVT robust design without any R or C templates. For example, the resistors R1 and R2 may be implemented by either resistor templates or transistors. The transistor-based resistor, however, may be preferred and may provide a much smaller silicon area. The capacitor C1 may be also implemented by transistors because it may be on the order of a few to fifty fFs (e.g. about 20 fF in some embodiments) instead of pF as may be found in some other IO receivers. Because the DC gain relies on the resistance ratio instead of the absolute resistance, the receiver 74 may be robust to the PVT variation.

Further advantageously, some embodiments of the receiver 74 may provide a high voltage (HV) tolerant design (e.g. the high supply voltage may be beyond the specification of the device). For example, the front end of the receiver 74 may be HV tolerant. For example, in DDR4 the voltage $V_{DD2}$ may be about 1.2V but the transistor on silicon may be safer to operate under about 1V. Even though the input voltage can be HV in some DDR standards, the voltage across the resistors R1, R2, R3, R4, the capacitor C1, and the inverter INV1 are all low voltages in the functional mode. Accordingly, no additional HV protection is needed. Advantageously, this feature greatly simplifies the design. Some embodiments of the receiver 74 may be easily ported to other processes to speed up derivative products. Some embodiments of the receiver 74 may also simplify the receiver training and calibration algorithms because fewer steps may be involved.

Additional Notes and Examples

Example 1 may include a receiver apparatus, comprising a termination circuit to receive an input signal, a first resistor having a first node coupled to the termination circuit and a second node, a capacitor having a first node coupled to the first node of the first resistor and a second node, a second resistor having a first node coupled to the second node of the capacitor and a second node, a third resistor having a first node coupled to the second node of the first resistor and a second node coupled to a common input front end voltage, a fourth resistor having a first node coupled to the second node of the first resistor and a second node coupled to ground, and a first inverter having a first node coupled to the second node of the first resistor and a second node coupled to the second node of the second resistor, wherein the third and fourth resistors each include a variable resistor and wherein a value for each of the third and fourth resistors is electronically adjustable to provide a switch threshold voltage at the first node of the first inverter in accordance with at least two types of memory devices.

Example 2 may include the receiver apparatus of Example 1, further comprising a fifth resistor having a first node coupled to the second node of the second resistor and a second node, and a second inverter having a first node coupled to the second node of the first inverter and a second node coupled to the second node of the fifth resistor.

Example 3 may include the receiver apparatus of any of Examples 1 to 2, wherein the at least two different types of memory devices include a first type of memory device, a second type of memory device, and a third type of memory device, and wherein for the first type of memory device the third variable resistor is adjusted to be substantially off and the fourth variable resistor is adjusted to be substantially off, and wherein when for the second type of memory device the third variable resistor is adjusted to be substantially off and the fourth variable resistor is adjusted to be substantially on, and wherein for the third type of memory device the third variable resistor is adjusted to be substantially on and the fourth variable resistor is adjusted to be substantially off.

Example 4 may include an electronic processing system, comprising a memory component, and an electronic component communicatively coupled to the memory component, the electronic component including a receiver to receive a signal from the memory component, wherein the receiver comprises high pass components to pass high frequency components of the signal, low pass components to pass low frequency components of the signal, and an amplifier communicatively coupled to the high pass components and the low pass components to amplify respective signals passed by the high pass components and the low pass components, wherein the low pass components include a level shifter to shift a common mode voltage level of the signal to a switch threshold voltage for the amplifier in accordance with at least two different types of memory devices.

Example 5 may include the electronic processing system of Example 4, wherein the amplifier comprises a self-biased inverter.

Example 6 may include the electronic processing system of any of Examples 4 to 5, wherein the high pass components, the low pass components, and the amplifier are all part of a single stage, continuous time linear equalizer which is electronically adjustable to receive signals from the at least two different types of memory devices.

Example 7 may include the electronic processing system of Example 5, wherein the high pass components comprise a capacitor which has at least two orders of magnitude greater impedance than a connected termination circuit.

Example 8 may include the electronic processing system of Example 5, wherein the level shifter comprises a variable resistor network which has at least two orders of magnitude greater resistance than a connected termination circuit.

Example 9 may include the electronic processing system of Example 8, wherein the variable resistor network comprises a first variable resistor having a first node coupled to a common input front end voltage and a second node coupled to the input of the self-biased inverter, and a second variable resistor having a first node coupled to the input of the self-biased inverter and a second node coupled to ground, wherein a value for each of the first and second variable resistors is electronically adjustable to provide the switch threshold voltage at the input of the self-biased inverter for the at least two different types of memory devices.

Example 10 may include the electronic processing system of Example 9, wherein the first and second variable resistors are each transistor-based.

Example 11 may include the electronic processing system of Example 10, wherein the at least two different types of memory devices include a first type of memory device, a second type of memory device, and a third type of memory device, and wherein for the first type of memory device the first variable resistor is adjusted to be substantially off and the second variable resistor is adjusted to be substantially off, and wherein when for the second type of memory device the first variable resistor is adjusted to be substantially off and the second variable resistor is adjusted to be substantially on, and wherein for the third type of memory device the first variable resistor is adjusted to be substantially on and the second variable resistor is adjusted to be substantially off.

Example 12 may include the electronic processing system of any of Examples 4 to 5, wherein a memory device included in the memory component comprises one of a double data rate dynamic random access memory and a low power double data rate dynamic random access memory.

Example 13 may include the electronic processing system of any of Examples 4 to 5, wherein the electronic component comprises one of a central processor unit and a memory controller.

Example 14 may include the electronic processing system of any of Examples 4 to 5, wherein the electronic component is further to determine a type of a memory device included in the memory component which is communicatively coupled to the electronic component and to configure the level shifter in accordance with the type of the memory device.

Example 15 may include a receiver apparatus, comprising high pass components to pass high frequency components of an input signal, low pass components to pass low frequency components of the input signal, and an amplifier communicatively coupled to the high pass components and the low pass components to amplify respective signals passed by the high pass components and the low pass components, wherein the low pass components include a level shifter to shift a common mode voltage level of the input signal to a switch threshold voltage for the amplifier in accordance with at least two different types of memory devices.

Example 16 may include the receiver apparatus of Example 15, wherein the amplifier comprises a self-biased inverter.

Example 17 may include the receiver apparatus of any of Examples 15 to 16, wherein the high pass components, the low pass components, and the amplifier are all part of a single stage, continuous time linear equalizer which is electronically adjustable to receive signals from the at least two different types of memory devices.

Example 18 may include the receiver apparatus of Example 16, wherein the high pass components comprise a capacitor which has at least two orders of magnitude greater impedance than a connected termination circuit.

Example 19 may include the receiver apparatus of Example 16, wherein the level shifter comprises a variable resistor network which has at least two orders of magnitude greater resistance than a connected termination circuit.

Example 20 may include the receiver apparatus of Example 19, wherein the variable resistor network comprises a first variable resistor having a first node coupled to a common input front end voltage and a second node coupled to the input of the self-biased inverter, and a second variable resistor having a first node coupled to the input of the self-biased inverter and a second node coupled to ground, wherein a value for each of the first and second variable resistors is electronically adjustable to provide the switch threshold voltage at the input of the self-biased inverter for the at least two different types of memory devices.

Example 21 may include the receiver apparatus of Example 20, wherein the first and second variable resistors are each transistor-based.

Example 22 may include the receiver apparatus of Example 21, wherein the at least two different types of memory devices include a first type of memory device, a second type of memory device, and a third type of memory device, and wherein for the first type of memory device the first variable resistor is adjusted to be substantially off and the second variable resistor is adjusted to be substantially off, and wherein when for the second type of memory device the first variable resistor is adjusted to be substantially off and the second variable resistor is adjusted to be substantially on, and wherein for the third type of memory device the first variable resistor is adjusted to be substantially on and the second variable resistor is adjusted to be substantially off.

Example 23 may include a method of receiving a signal, comprising receiving an input signal, shifting a common mode voltage level of the input signal to a switching threshold voltage in accordance with at least two different types of memory devices; attenuating low-frequency components of the input signal, amplifying components of the input signal around a first frequency, filtering high-frequency components of the input signal, and inverting an output signal based on the level shifted input signal.

Example 24 may include the method of Example 23, wherein the switching threshold voltage is about one half of a common input front end voltage.

Example 25 may include the method of any of Examples 23 to 24, wherein the low-frequency components of the input signal correspond to frequencies below about a roll-off frequency, the first frequency corresponds to about two thirds of a data rate frequency, and the high-frequency components of the input signal correspond to frequencies above about two thirds of the data rate frequency.

Example 26 may include the method of any of Examples 23 to 24, wherein the input signal originates from a memory component, the method further comprising determining a type of a memory device included in the memory component, and shifting the common mode voltage level in accordance with the determined type of the memory device.

Example 27 may include the method of Example 26, wherein the memory device comprises one of a double data rate dynamic random access memory and a low power double data rate dynamic access memory.

Example 28 may include at least one computer readable storage media comprising a set of instructions, which when executed by a computing device, cause the computing device to receive an input signal, shift a common mode voltage level of the input signal to a switch threshold voltage in accordance with at least two different types of memory devices, attenuate low-frequency components of the input signal, amplify components of the input signal around a first frequency, filter high-frequency components of the input signal, and invert an output signal based on the level shifted input signal.

Example 29 may include the at least one computer readable storage media of Example 28, wherein the switch threshold voltage is about one half of a common input front end voltage.

Example 30 may include the at least one computer readable storage media of any of Examples 28 to 29, wherein the low-frequency components of the input signal correspond to frequencies below about a roll-off frequency, the first frequency corresponds to about two thirds of a data rate frequency, and the high-frequency components of the input signal correspond to frequencies above about two thirds of the data rate frequency.

Example 31 may include the at least one computer readable storage media of any of Examples 28 to 29, comprising a further set of instructions, which when executed by the computing device, cause the computing device to determine a type of a memory device included in the memory component, and shift the common mode voltage level in accordance with the determined type of the memory device.

Example 32 may include the at least one computer readable storage media of Example 31, wherein the memory device comprises one of a double data rate dynamic random access memory and a low power double data rate dynamic access memory.

Example 33 may include an electronic processing system, comprising means for receiving an input signal, means for shifting a common mode voltage level of the input signal to a switching threshold voltage in accordance with at least two different types of memory devices, means for attenuating low-frequency components of the input signal, means for amplifying components of the input signal around a first frequency, means for filtering high-frequency components of the input signal, and means for inverting an output signal based on the level shifted input signal.

Example 34 may include the electronic processing system of Example 33, wherein the switching threshold voltage is about one half of a common input front end voltage.

Example 35 may include the electronic processing system of any of Examples 33 to 34, wherein the low-frequency components of the input signal correspond to frequencies below about a roll-off frequency, the first frequency corresponds to about two thirds of a data rate frequency, and the high-frequency components of the input signal correspond to frequencies above about two thirds of the data rate frequency.

Example 36 may include the electronic processing system of any of Examples 33 to 34, wherein the input signal originates from a memory component, the method further comprising means for determining a type of a memory device included in the memory component, and means for shifting the common mode voltage level in accordance with the determined type of the memory device.

Example 37 may include the electronic processing system of Example 36, wherein the memory device comprises one of a double data rate dynamic random access memory and a low power double data rate dynamic access memory.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/ or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. An electronic processing system, comprising:
   a memory component; and
   an electronic component communicatively coupled to the memory component, the electronic component including a receiver to receive a signal from the memory component,
   wherein the receiver comprises:
      high pass components to pass high frequency components of the signal;
      low pass components to pass low frequency components of the signal; and
      an amplifier communicatively coupled to the high pass components and the low pass components to amplify respective signals passed by the high pass components and the low pass components,
   wherein the low pass components include a level shifter to shift a common mode voltage level of the signal to a switch threshold voltage for the amplifier in accordance with at least two different types of memory devices for the memory component.

2. The electronic processing system of claim 1, wherein the amplifier comprises a self-biased inverter.

3. The electronic processing system of claim 2, wherein the high pass components, the low pass components, and the amplifier are all part of a single stage, continuous time linear equalizer which is electronically adjustable to receive signals from the at least two different types of memory devices.

4. The electronic processing system of claim 2, wherein the high pass components comprise a capacitor which has at least two orders of magnitude greater impedance than a connected termination circuit below the bandwidth of the receiver.

5. The electronic processing system of claim 2, wherein the level shifter comprises a variable resistor network which has at least two orders of magnitude greater resistance than a connected termination circuit.

6. The electronic processing system of claim 5, wherein the variable resistor network comprises:
   a first variable resistor having a first node coupled to a common input front end voltage and a second node coupled to the input of the self-biased inverter; and
   a second variable resistor having a first node coupled to the input of the self-biased inverter and a second node coupled to ground,
   wherein a value for each of the first and second variable resistors is electronically adjustable to provide the switch threshold voltage at the input of the self-biased inverter for the at least two different types of memory devices.

7. The electronic processing system of claim 6, wherein the first and second variable resistors are each transistor-based.

8. The electronic processing system of claim 7, wherein the at least two different types of memory devices include a first type of memory device, a second type of memory device, and a third type of memory device,
- and wherein for the first type of memory device the first variable resistor is adjusted to be substantially off and the second variable resistor is adjusted to be substantially off,
- and wherein for the second type of memory device the first variable resistor is adjusted to be substantially off and the second variable resistor is adjusted to be substantially on,
- and wherein for the third type of memory device the first variable resistor is adjusted to be substantially on and the second variable resistor is adjusted to be substantially off.

9. The electronic processing system of claim 1, wherein a memory device included in the memory component comprises one of a double data rate dynamic random access memory and a low power double data rate dynamic random access memory.

10. The electronic processing system of claim 1, wherein the electronic component comprises one of a central processor unit and a memory controller.

11. The electronic processing system of claim 1, wherein the electronic component is further to determine a type of a memory device included in the memory component which is communicatively coupled to the electronic component and to configure the level shifter in accordance with the type of the memory device.

12. A receiver apparatus, comprising:
- high pass components to pass high frequency components of an input signal;
- low pass components to pass low frequency components of the input signal; and
- an amplifier communicatively coupled to the high pass components and the low pass components to amplify respective signals passed by the high pass components and the low pass components,
- wherein the low pass components include a level shifter to shift a common mode voltage level of the input signal to a switch threshold voltage for the amplifier in accordance with at least two different types of memory devices.

13. The receiver apparatus of claim 12, wherein the amplifier comprises a self-biased inverter.

14. The receiver apparatus of claim 13, wherein the high pass components, the low pass components, and the amplifier are all part of a single stage, continuous time linear equalizer which is electronically adjustable to receive signals from the at least two different types of memory devices.

15. The receiver apparatus of claim 13, wherein the high pass components comprise a capacitor which has at least two orders of magnitude greater impedance than a connected termination circuit.

16. The receiver apparatus of claim 13, wherein the level shifter comprises a variable resistor network which has at least two orders of magnitude greater resistance than a connected termination circuit.

17. The receiver apparatus of claim 16, wherein the variable resistor network comprises:
- a first variable resistor having a first node coupled to a common input front end voltage and a second node coupled to the input of the self-biased inverter; and
- a second variable resistor having a first node coupled to the input of the self-biased inverter and a second node coupled to ground,
- wherein a value for each of the first and second variable resistors is electronically adjustable to provide the switch threshold voltage at the input of the self-biased inverter for the at least two different types of memory devices.

18. The receiver apparatus of claim 17, wherein the first and second variable resistors are each transistor-based.

19. The receiver apparatus of claim 18, wherein the at least two different types of memory devices include a first type of memory device, a second type of memory device, and a third type of memory device,
- and wherein for the first type of memory device the first variable resistor is adjusted to be substantially off and the second variable resistor is adjusted to be substantially off,
- and wherein for the second type of memory device the first variable resistor is adjusted to be substantially off and the second variable resistor is adjusted to be substantially on,
- and wherein for the third type of memory device the first variable resistor is adjusted to be substantially on and the second variable resistor is adjusted to be substantially off.

* * * * *